(12) United States Patent
Lim et al.

(10) Patent No.: US 9,330,773 B2
(45) Date of Patent: May 3, 2016

(54) SEMICONDUCTOR MEMORY APPARATUS AND METHOD FOR READING DATA FROM THE SAME

(71) Applicant: SK hynix Inc., Gyeonggi-do (KR)

(72) Inventors: In Geun Lim, Seoul (KR); Min Kyu Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/572,717

(22) Filed: Dec. 16, 2014

(65) Prior Publication Data

US 2016/0019969 A1    Jan. 21, 2016

(30) Foreign Application Priority Data

Jul. 15, 2014   (KR) .................. 10-2014-0089235

(51) Int. Cl.
| | | |
|---|---|---|
| G11C 11/34 | (2006.01) | |
| G11C 16/20 | (2006.01) | |
| G11C 16/08 | (2006.01) | |
| G11C 16/04 | (2006.01) | |
| G11C 16/26 | (2006.01) | |

(52) U.S. Cl.
CPC ............ *G11C 16/20* (2013.01); *G11C 16/0483* (2013.01); *G11C 16/08* (2013.01); *G11C 16/26* (2013.01)

(58) Field of Classification Search
USPC .............. 365/185.11, 185.12, 185.17, 185.21, 365/185.33
See application file for complete search history.

(56) References Cited

U.S. PATENT DOCUMENTS

| | | | | |
|---|---|---|---|---|
| 6,411,548 | B1 * | 6/2002 | Sakui ............... | G11C 11/22 365/185.17 |
| 7,035,143 | B2 * | 4/2006 | Lee .................... | G11C 16/24 365/185.17 |
| 7,286,398 | B2 * | 10/2007 | Yano ................ | G11C 16/0466 365/185.17 |
| 7,529,130 | B2 * | 5/2009 | Toda ................. | G11C 11/5642 365/185.17 |
| 7,590,006 | B2 * | 9/2009 | Tokiwa ............. | G11C 16/3436 365/185.17 |
| 7,649,777 | B2 * | 1/2010 | Ichige .............. | G11C 16/0483 365/185.17 |
| 8,270,215 | B2 * | 9/2012 | You .................. | G11C 16/10 365/185.17 |
| 8,274,837 | B2 * | 9/2012 | Nakamura ........ | G11C 16/16 365/185.17 |
| 8,526,237 | B2 | 9/2013 | Samachisa et al. | |
| 8,897,069 | B2 * | 11/2014 | Choi ................. | G11C 16/0483 365/185.11 |
| 9,019,764 | B2 * | 4/2015 | Lee .................. | G11C 16/10 365/185.11 |

FOREIGN PATENT DOCUMENTS

| | | |
|---|---|---|
| KR | 1020100097468 | 9/2010 |
| KR | 1020110106682 | 9/2011 |

* cited by examiner

*Primary Examiner* — Trong Phan
(74) *Attorney, Agent, or Firm* — IP & T Group LLP

(57) ABSTRACT

A semiconductor memory device according to an embodiment of the present invention includes a first cell string and a second cell string coupled to a first word line group and a second word line group, respectively. An operating method of the semiconductor memory device may include forming a channel in the second cell string by applying a pass voltage to the second word line group, reflecting data of a selected memory cell coupled to a selected word line of the first word line group, among memory cells of the first cell string, on the channel of the second cell string through the bit line, and determining the data of the selected memory cell by sensing a quantity of electric charge of the second cell string through the bit line.

20 Claims, 13 Drawing Sheets

- READ DATA FROM SELECTED PAGE
- OUTPUT READ DATA
- REFLECT DATA FROM SELECTED PAGE ON CELL STRING MIRRORS
- READ DATA FROM CELL STRING MIRRORS

- READ DATA FROM SELECTED PAGE
- OUTPUT READ DATA
- REFLECT DATA FROM SELECTED PAGE ON CELL STRING MIRRORS
- READ DATA FROM CELL STRING MIRRORS

US 9,330,773 B2

SEMICONDUCTOR MEMORY APPARATUS AND METHOD FOR READING DATA FROM THE SAME

CROSS-REFERENCE TO RELATED APPLICATION

The present application claims priority to Korean patent application number 10-2014-0089235, filed on Jul. 15, 2014, the entire disclosure of which is incorporated herein in its entirety by reference.

BACKGROUND

Field of Invention

Various exemplary embodiments of the present invention relate generally to an electronic device, and more particularly, to a semiconductor memory device and an operating method thereof.

Semiconductor memory devices are embodied with semiconductors such as silicon (Si), germanium (Ge), gallium arsenide (GaAs), or indium phosphide (Inp). Semiconductor memory devices are classified into volatile memory devices and non-volatile memory devices.

Volatile memory devices may lose stored data when the power is off. Examples of volatile memory devices include Static RAM (SRAM), Dynamic RAM (DRAM) and Synchronous DRAM (SDRAM). Non-volatile memory devices may retain stored data regardless of power on/off conditions. Examples of non-volatile memory include Read Only Memory (ROM), Mask ROM (MROM), Programmable ROM (PROM), Erasable Programmable ROM (EPROM), Electrically Erasable Programmable ROM (EEPROM), flash memory, Phase-change Random Access Memory (PRAM), Magnetoresistive RAM (MRAM), Resistive RAM (RRAM) and Ferroelectric RAM (FRAM). Flash memories may be classified into NOR-type memories and NAND-type memories.

In order to improve the degree of integration in semiconductor memory devices, research has been conducted on semiconductor memory devices having a three-dimensional array structure.

SUMMARY

The present invention is directed to a semiconductor memory device having improved read speed and an operating method thereof.

An operating method of a semiconductor memory device including a first cell string and a second cell string sharing a bit line and coupled to a first word line group and a second word line group, respectively, according to an embodiment of the present invention may include forming a channel in the second cell string by applying a first pass voltage to the second word line group, reflecting data of a selected memory cell coupled to a selected word line of the first word line group, among memory cells of the first cell string, on the channel of the second cell string through the bit line, and determining the data of the selected memory cell by sensing a quantity of electric charge of the second cell string through the bit line.

The forming of the channel in the second cell string may include applying a bit line voltage to the bit line, and initializing the channel of the second cell string in response to the bit line voltage by electrically connecting the second cell string to the bit line.

The reflecting of the data of the selected memory cell on the channel of the second cell string may include reflecting the data of the selected memory cell on the bit line, wherein the quantity of electric charge of the second cell string varies with a voltage of the bit line.

The operating method may further include electrically separating the second cell string from the bit line after the data of the selected memory cell is reflected on the channel of the second cell string.

The determining of the data of the selected memory cell may include forming the channel in the second cell string by applying a second pass voltage to the second word line group, and electrically connecting the channel of the second cell string to the bit line to reflect the quantity of electric charge of the second cell string on the bit line.

The determining of the data of the selected memory cell may further include determining the data of the selected memory cell by sensing a voltage of the bit line.

In the determining of the data of the selected memory cell, the first cell string may be electrically separated from the bit line.

The operating method may further include forming a channel in the first cell string by applying a bit line voltage to the bit line and applying a second pass voltage to the first word line group, and initializing the channel of the first cell string in response to the bit line voltage by electrically connecting the first cell string to the bit line.

The determining of the data of the selected memory cell may be performed within a predetermined period of time after the reflecting of the data of the selected memory cell on the channel of the second cell string.

A semiconductor memory device according to another embodiment of the present invention may include a first cell string coupled to a first word line group, a second cell string coupled to a second word line group and suitable for sharing a bit line with the first cell string, and a peripheral circuit suitable for forming a channel in the second cell string by applying a pass voltage to the second word line group, reflecting data of a selected memory cell in the first cell string on the channel of the second cell string through the bit line, and determining the data of the selected memory cell by sensing a quantity of electric charge of the channel of the second cell string through the bit line.

The peripheral circuit may include an address decoder coupled to the first and second word line groups, and a page buffer suitable for providing a bit line voltage to the bit line, wherein the address decoder is suitable for applying the pass voltage to the second word line group to form the channel in the second cell string, and electrically connecting the second cell string to the bit line to initialize the channel of the second cell string in response to the bit line voltage.

The address decoder may select a word line from the first word line group, electrically connect the first cell string to the bit line and reflect the data of the selected memory cell on the bit line, and the quantity of electric charge of the channel of the second cell string may vary with a voltage of the bit line.

An operating method of a semiconductor memory device according to another embodiment of the present invention may include reflecting data bits of a first page in first cell strings on channels of second cell strings through bit lines, wherein the first and second cell strings are suitable for sharing bit lines and coupled to a first word line group and a second word line group, respectively, determining and storing the data bits of the first page by sensing a quantity of electric charge of the channels of the second cell strings through the bit lines, and outputting the data bits of the first page.

The operating method may further include reflecting data bits of a second page in the first cell strings on channels of third cell strings through the bit lines during the outputting of the data bits of the first page, wherein the third cell strings are coupled to a third word line group and suitable for sharing the bit lines with the first cell strings.

The operating method may further include determining and storing the data bits of the second page by sensing a quantity of electric charge of the channels of the third cell strings through the bit lines, and outputting the data bits of the second page.

The sensing of the quantity of electric charge of the channels of the third cell strings may be performed during the outputting of the data bits of the first page.

The operating method may further include reflecting data bits of a second page of the first cell strings on the channels of the second cell strings through the bit lines during the outputting of the data bits of the first page.

The operating method may further include determining and storing the data bits of the second page by sensing the quantity of electric charge of the channels of the second cell strings through the bit lines, and outputting the data bits of the second page.

The operating method may further include reflecting data bits of a second page of third cell strings on the channels of the second cell strings through the bit lines during the outputting of the data bits of the first page, determining and storing the data bits of the second page by sensing the quantity of electric charge of the channels of the second cell strings through the bit lines, and outputting the data bits of the second page, wherein the third cell strings are coupled to a third word line group and suitable for sharing the bit lines with the second cell strings.

The operating method further may include reflecting data bits of a second page of third cell strings on channels of fourth cell strings through the bit lines during the outputting of the data bits of the first page, determining and storing the data bits of the second page by sensing a quantity of electric charge of the channels of the fourth cell strings through the bit lines, and outputting the data bits of the second page, wherein the third and fourth cell strings are suitable for sharing bit lines and coupled to a third word line group and a fourth word line group, respectively.

DETAILED DESCRIPTION

Figure 1:
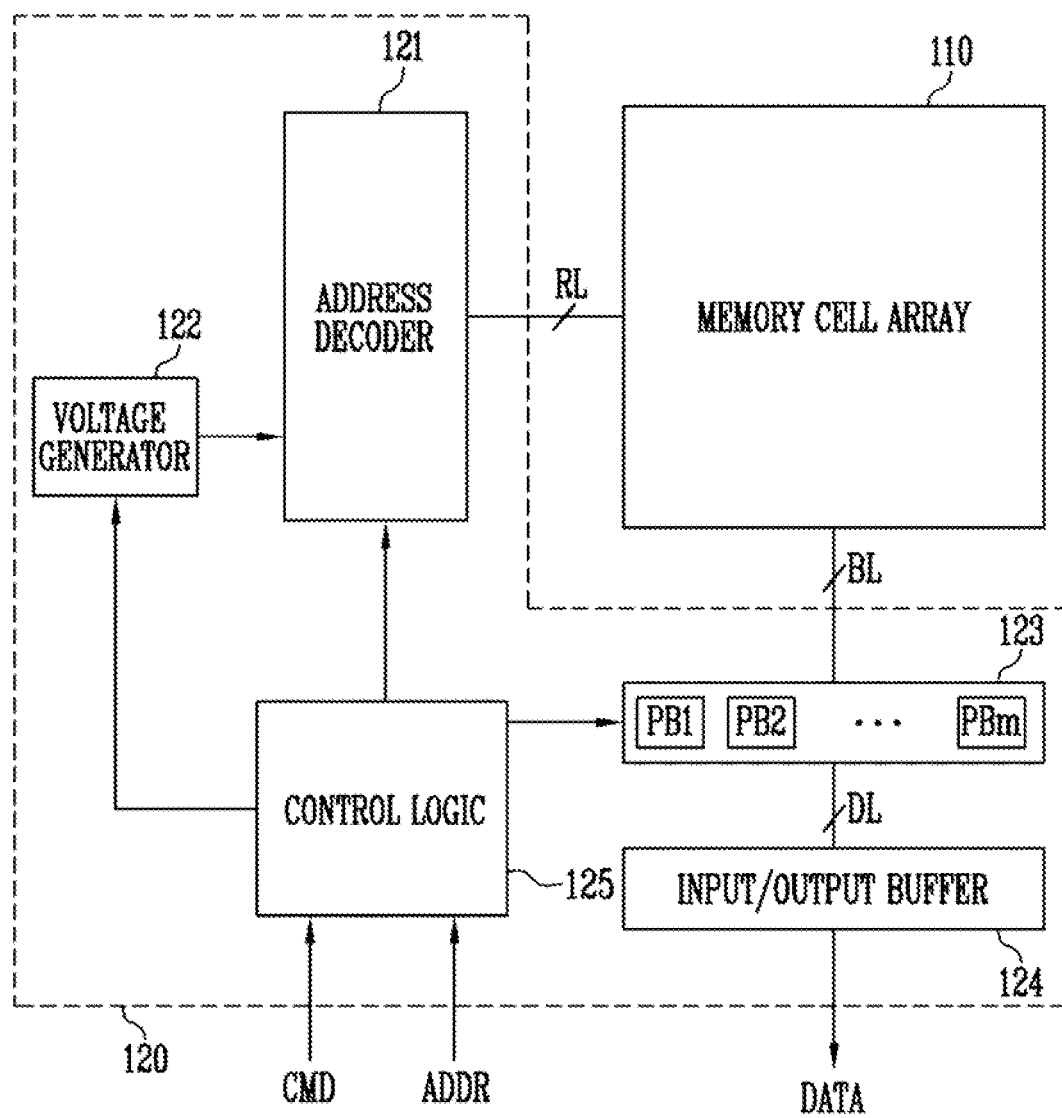
FIG. 1 is a block diagram Illustrating a semiconductor memory device.

Hereinafter, various embodiments will be described in detail with reference to the accompanying drawings. The figures are provided to allow those with ordinary skill in the art to understand the scope of the embodiments of the invention. The present invention may, however, be embodied in different forms and should not be construed as limited to the embodiments set forth. Rather, these embodiments are provided so that this disclosure will be thorough and complete. In addition, the embodiments are provided to fully convey the scope of the invention to those skilled in the art.

Throughout the disclosure, like reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form, and vice versa, as long as it is not specified.

Figure 2:
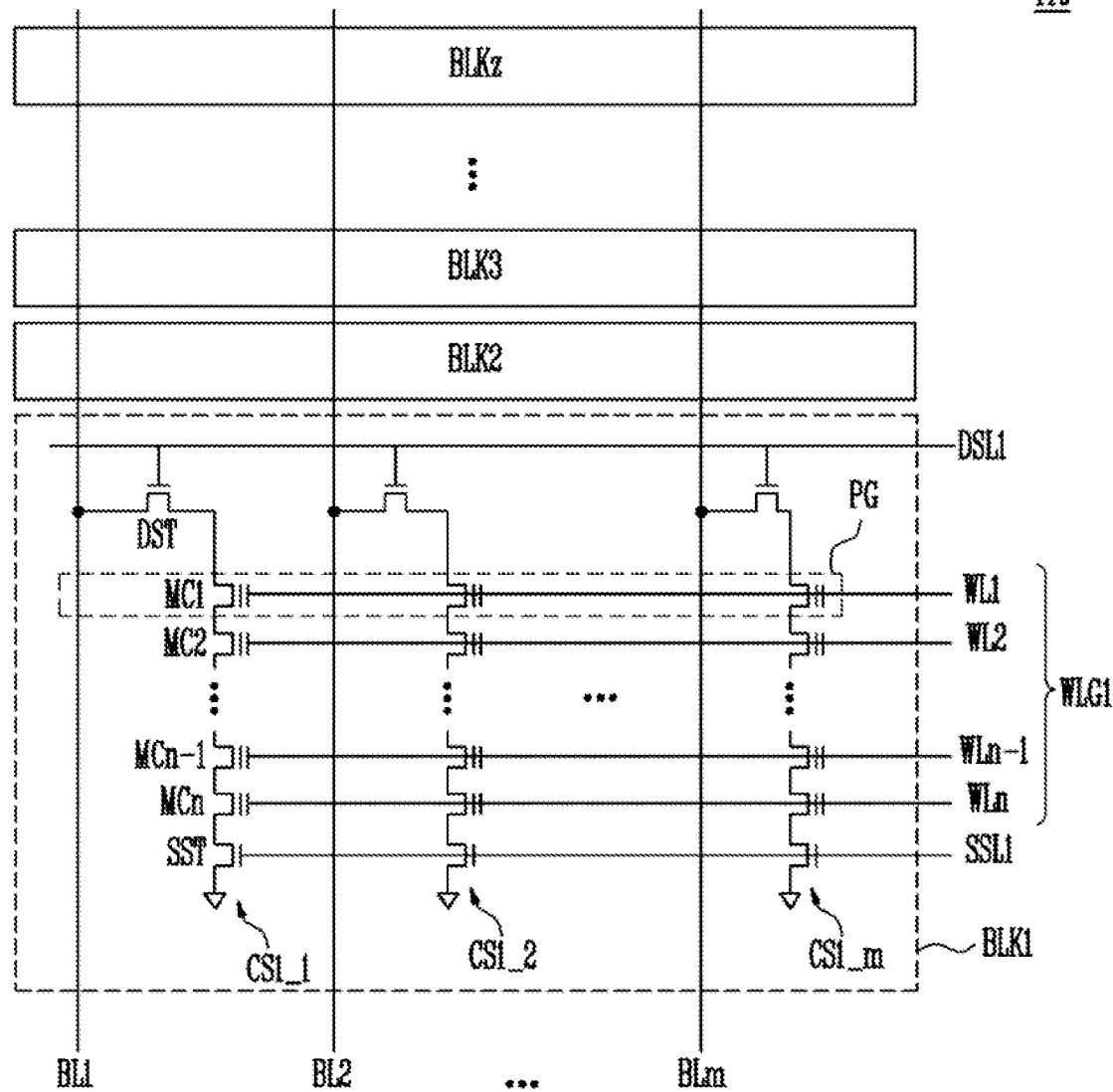
FIG. 2 is a block diagram illustrating a memory cell array shown in FIG. 1.

FIG. 1 is a block diagram illustrating a semiconductor memory device 100. FIG. 2 is a block diagram illustrating a memory cell array 110 shown in FIG. 1.

Referring to FIG. 1, the semiconductor memory device 100 may include a memory cell array 110 and a peripheral circuit 120.

The memory cell array 110 may include a plurality of memory cells. The plurality of memory cells may be coupled to an address decoder 121 through row lines RL and coupled to a read and write circuit 123 through bit lines BL. According to an embodiment, the memory cells of the memory cell array 110 may be non-volatile memory cells.

Referring to FIG. 2, the memory cell array 110 may include a plurality of memory blocks BLK1 to BLKz. The first to z-th memory blocks BLK1 to BLKz may be coupled in common to first to m-th bit lines BL1 to BLm. The first to m-th bit lines BL1 to BLm may form the bit lines BL shown in FIG. 1. Each of the plurality of memory blocks BLK1 to BLKz may be a basic unit for an erase operation.

In FIG. 2, for a simplified explanation, components included in one (BLK1) of the memory blocks BLK1 to BLKz are illustrated, and elements included in the other memory blocks BLK2 to BLKz are omitted. Each of the memory blocks BLK2 to BLKz may be configured in substantially the same manner as the first memory block BLK1.

Each memory block may be coupled to a single word line group. In FIG. 2, the first memory block BLK1 may be coupled to a first word line group WLG1. The first word line group WLG1 may include first to n-th word lines WL1 to WLn.

The first memory block BLK1 may include a plurality of cell strings CS1_1 to CS1_m. The first to m-th cell strings CS1_1 to CS1_m may be coupled to the first to m-th bit lines BL1 to BLm, respectively.

Each of the cell strings CS1_1 to CS1_m may include a drain selection transistor DST, a plurality of memory cells MC1 to MCn coupled in series, and a source selection transistor SST. The drain selection transistor DST may be coupled to a drain selection line DSL1. The first to n-th memory cells MC1 to MCn may be coupled to the first to n-th word lines WL1 to WLn, respectively. The source selection transistor SST may be coupled to a source selection line SSL1. A drain side of the drain selection transistor DST may be coupled to a corresponding bit line. A source side of the source selection transistor SST may be coupled to a reference voltage node. According to an embodiment, the source side of the source selection transistor SST may be coupled to a common source line (not illustrated). The common source line may be biased by a reference voltage.

Memory cells coupled to a single word line in the first to m-th cell strings CS1_1 to CS1_m may form a single page PG.

The drain selection line DSL1, the first to n-th word lines WL1 to WLn and the source selection line SSL1 may be included in the row lines RL shown in FIG. 1. The drain selection line DSL1, the first to n-th word lines WL1 to WLn and the source selection line SSL1 may be controlled by the address decoder 121. The first to m-th bit lines BL1 to BLm may be controlled by the read and write circuit 123.

Referring again to FIG. 1, the peripheral circuit 120 may include the address decoder 121, a voltage generator 122, the read and write circuit 123, an input/output buffer 124 and a control logic 125.

The address decoder 121 may be coupled to the memory cell array 110 through the row lines RL. The address decoder 121 may be controlled by the control logic 125. The address decoder 121 may receive addresses ADDR through the control logic 125.

A read operation of the semiconductor memory device 100 may be performed on each page (see PG in FIG. 2) as a basic unit. The addresses ADDR received during the read operation may include a block address and a row address.

The address decoder 121 may be configured to decode the block address, among the received addresses ADDR. The address decoder 121 may select one of the memory blocks BLK1 to BLKz in response to the decoded block address.

The address decoder 121 may be configured to decode the row address, among the received addresses ADDR, and select one of the word lines in a selected memory block in response to the decoded row address. The address decoder 121 may apply a read voltage from the voltage generator 122 to a selected word line and apply a pass voltage from the voltage generator 122 to unselected word lines.

The voltage generator 122 may be controlled by the control logic 125. The voltage generator 122 may generate an internal power supply voltage by using an external power supply voltage provided to the semiconductor memory device 100. For example, the voltage generator 122 may regulate the external power supply voltage to generate the internal power supply voltage. The generated internal power supply voltage may be provided to the address decoder 121, the read and write circuit 123, the input/output buffer 124 and the control logic 125, and used as an operating voltage for the semiconductor memory device 100.

The voltage generator 122 may generate a plurality of voltages by using at least one of the external power supply voltage and the internal power supply voltage. According to an embodiment, the voltage generator 122 may include a plurality of pumping capacitors receiving the internal power supply voltage, and generate a plurality of voltages by selectively activating the plurality of pumping capacitors in response to control of the control logic 125. For example, the voltage generator 122 may generate the read voltage and the pass voltage having a higher level than the read voltage during the read operation. The generated read and pass voltages may be provided to the address decoder 121.

The read and write circuit 123 may be coupled to the memory cell array 110 through the bit lines BL. The read and write circuit 123 may include a plurality of page buffers PB1 to PBm. The page buffers PB1 to PBm may be controlled by the control logic 125.

The page buffers PB1 to PBm may read the data DATA from the memory cell array 110 and store the data DATA during the read operation. The read data DATA may be transferred to the input/output buffer 124 through data lines DL.

The input/output buffer 124 may be coupled to the read and write circuit 123 through the data lines DL. The input/output buffer 124 may be controlled by the control logic 125. The input/output buffer 124 may externally output the data DATA transferred from the page buffers PB1 to PBm through the data lines DL.

The control logic 125 may receive a command CMD and the addresses ADDR. The control logic 125 may include an address buffer (not Illustrated). When the addresses ADDR are continuously received, the received addresses ADDR may be stored in the address buffer and provided to the address decoder 121.

The control logic 125 may be configured to control the address decoder 121, the voltage generator 122, the read and write circuit 123 and the input/output buffer 124 in response to the received command CMD.

According to an embodiment, the control logic 125 may control the address decoder 121 and the read and write circuit 123 so that data of a selected page of a selected memory block (e.g., BLK1 In FIG. 2) may be reflected on cell strings of another memory block (e.g., BLK2 in FIG. 2) through the bit lines BL1 to BLm. Each of the cell strings may have a predetermined capacitance. In other words, each cell string may operate as a capacitor which maintains electric charges at a reference level or more for a predetermined amount of time after being charged. When the data of the selected page of the selected memory block is reflected on the cell strings of another memory block, reliability of the reflected data may be maintained for a predetermined amount of time.

Before the predetermined amount of time passes, the control logic 125 may control the address decoder 121 and the read and write circuit 123 to sense the quantity of electric charge left in the corresponding cell strings and determine the data of the selected page.

When the data is read from the selected page by the read and write circuit 123 through the bit lines BL1 to BLm, it takes relatively long time to perform the read operation. For example, the bit lines BL1 to BLm may be precharged by the page buffer (123), and the read voltage may be applied to the selected word line so that the data of the selected page may be reflected on the bit lines BL1 to BLm for a predetermined amount of time, and the data may be read by determining the quantity of electric charge of the bit lines BL1 to BLm. It takes relatively long time to perform these processes.

According to an embodiment, after the data of the selected page of the selected memory block is reflected on the cell strings of another memory block through the bit lines BL1 to BLm, the quantity of electric charge stored in the cell strings may be sensed at an appropriate time, so that the data of the selected page may be determined.

According to an embodiment, when the read and write circuit 123 reads data from a first page and the read data is outputted to the input/output buffer 124, data of a second page of one memory block may be reflected on cell strings of another memory block through the bit lines BL1 to BLm. In other words, reflecting the data of the second page on the cell strings may overlap with outputting the data of the first page. The time taken to perform the read operation on the second page may correspond to the time taken to sense the quantity of electric charge stored in the corresponding cell strings.

Therefore, a semiconductor memory device having improved read operation speed may be realized.

Figure 3:
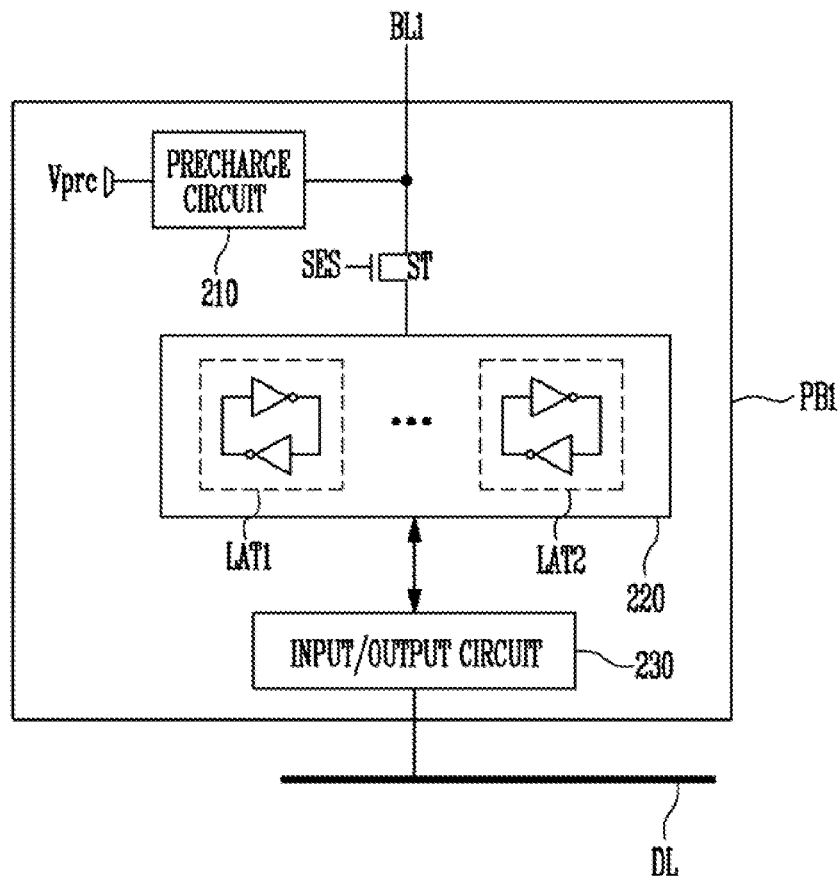
FIG. 3 is a block diagram illustrating one of the page buffers shown in FIG. 1.

FIG. 3 is a block diagram illustrating one (PB1) of the page buffers PB1 to PBm shown in FIG. 1.

Referring to FIG. 3, the page buffer PB1 may include a precharge circuit 210, a bit line selection transistor ST, a sensing circuit 220 and an input/output circuit 230.

The precharge circuit 210 may be coupled to the bit line BL1. The precharge circuit 210 may transfer a precharge voltage Vprc to the bit line BL1 in response to control of the control logic 125, shown in FIG. 1. According to an embodiment, the precharge circuit 210 may include a switching device which is controlled by the control logic 125.

The bit line selection transistor ST may be coupled between the bit line BL1 and the sensing circuit 220. The bit line selection transistor ST may electrically couple the bit line BL1 and the sensing circuit 220 in response to a sensing signal SES received from the control logic 125.

The sensing circuit 220 may be coupled to the bit line BL1 through the bit line selection transistor ST. The sensing circuit 220 may include a plurality of latch circuits LAT1 and LAT2. When the bit line selection transistor ST is turned on, the sensing circuit 220 may sense the quantity of electric charge of the bit line BL1 and store corresponding data in one of the latch circuits LAT1 and LAT2. The sensed and stored data may be transferred to the input/output circuit 230.

The input/output circuit 230 may be coupled between the sensing circuit 220 and the data lines DL. The input/output circuit 230 may be controlled by the control logic 125. The input/output circuit 230 may output the data stored in one of the latch circuits LAT1 and LAT2 to the data lines DL.

FIG. 3 illustrates the page buffer PB1 coupled to the single bit line BL1. However, this is merely an example and the scope of the present invention is not limited thereto. According to an embodiment, the page buffer PB1 may be coupled to an even bit line and an odd bit line and configured to select one of the even and odd bit lines.

Figure 4:
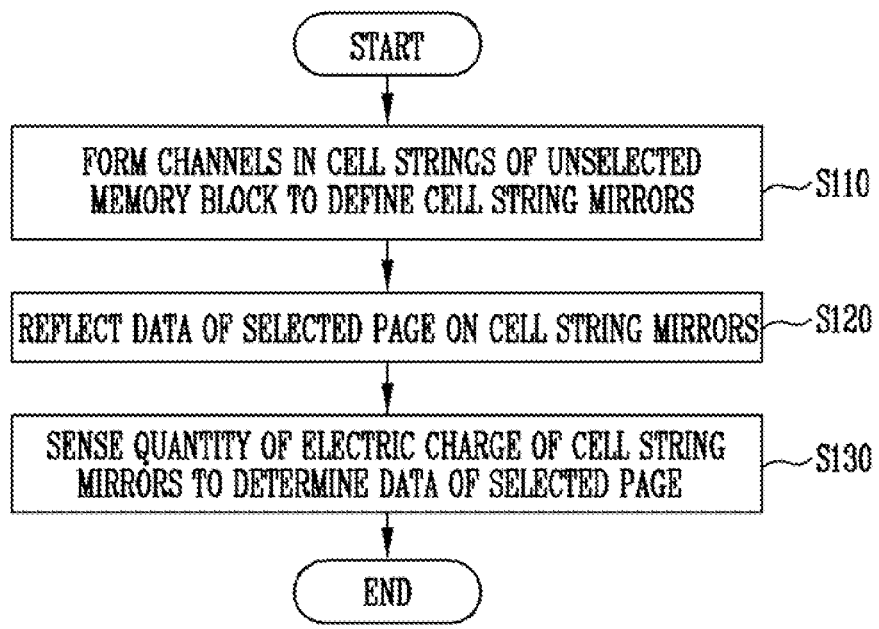
FIG. 4 is a flowchart illustrating a read method according to an embodiment of the present invention.

FIG. 4 is a flowchart illustrating a read method according to an embodiment of the present invention.

Referring to FIGS. 2 and 4, at step S110, channels may be formed in cell strings of an unselected memory block, and the cell strings in which the channels are formed may be defined as cell string mirrors.

It is described as an example that the first memory block BLK1 is selected and the second memory block BLK2 is not selected. In addition, the first word line WL1 is described to be selected in the first memory block BLK1.

The pass voltage may be applied to word lines coupled to the second memory block BLK2. As the pass voltage is applied, the memory cells of the second memory block BLK2 may be turned on, and channels may be formed in the cell strings thereof.

At step S120, data of the selected page may be reflected on the cell string mirrors.

Threshold voltages of memory cells coupled to the first word line WL1 of the first memory block BLK1 may be reflected on the first to m-th bit lines BL1 to BLm. When the cell string mirrors are electrically connected to the first to m-th bit lines BL1 to BLm, the quantity of electric charge of channels of the cell string mirrors may vary depending on the quantity of electric charge of the first to m-th bit lines BL1 to BLm, respectively.

At step S130, the data of the selected page may be determined by sensing the quantity of electric charge of the cell string mirrors.

The cell string mirrors may be electrically connected to the first to m-th bit lines BL1 to BLm. Voltages of the first to m-th bit lines BL1 to BLm may vary depending on the quantity of electric charge of the cell string mirrors. The data of the selected page may be determined by sensing the voltages of the first to m-th bit lines BL1 to BLm.

Figure 5:
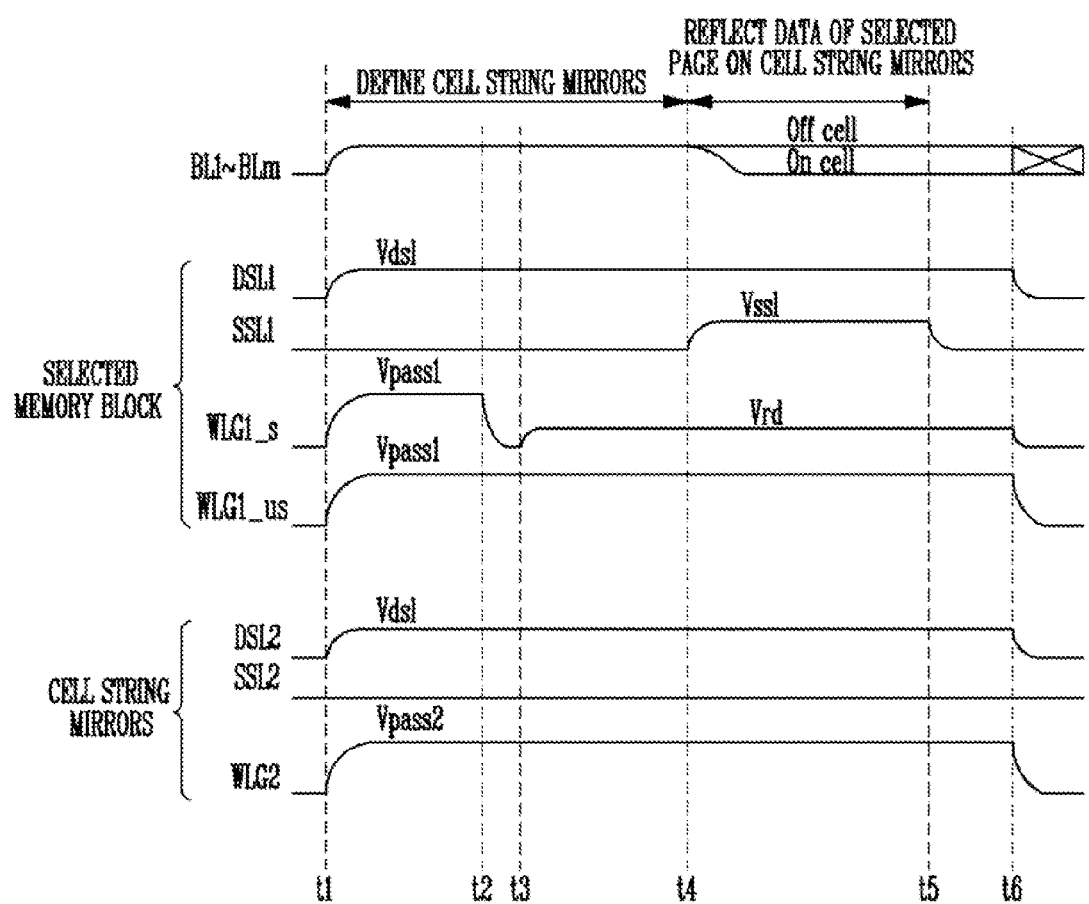
FIG. 5 is a timing diagram illustrating an embodiment of step S110 and step S120 shown in FIG. 4.
Figure 6:
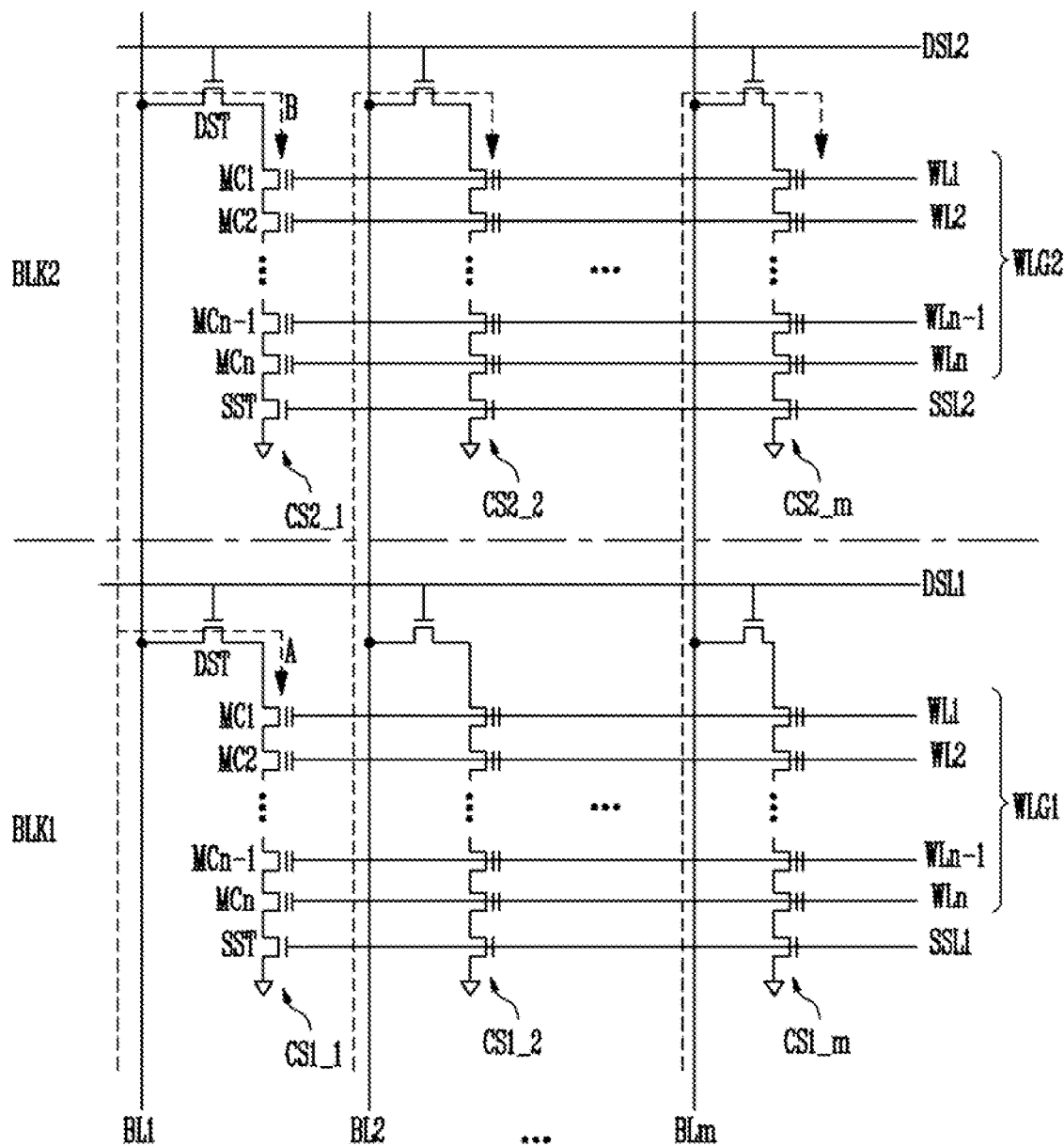
FIG. 6 is a diagram conceptually illustrating step S110 shown in FIG. 4.
Figure 7:
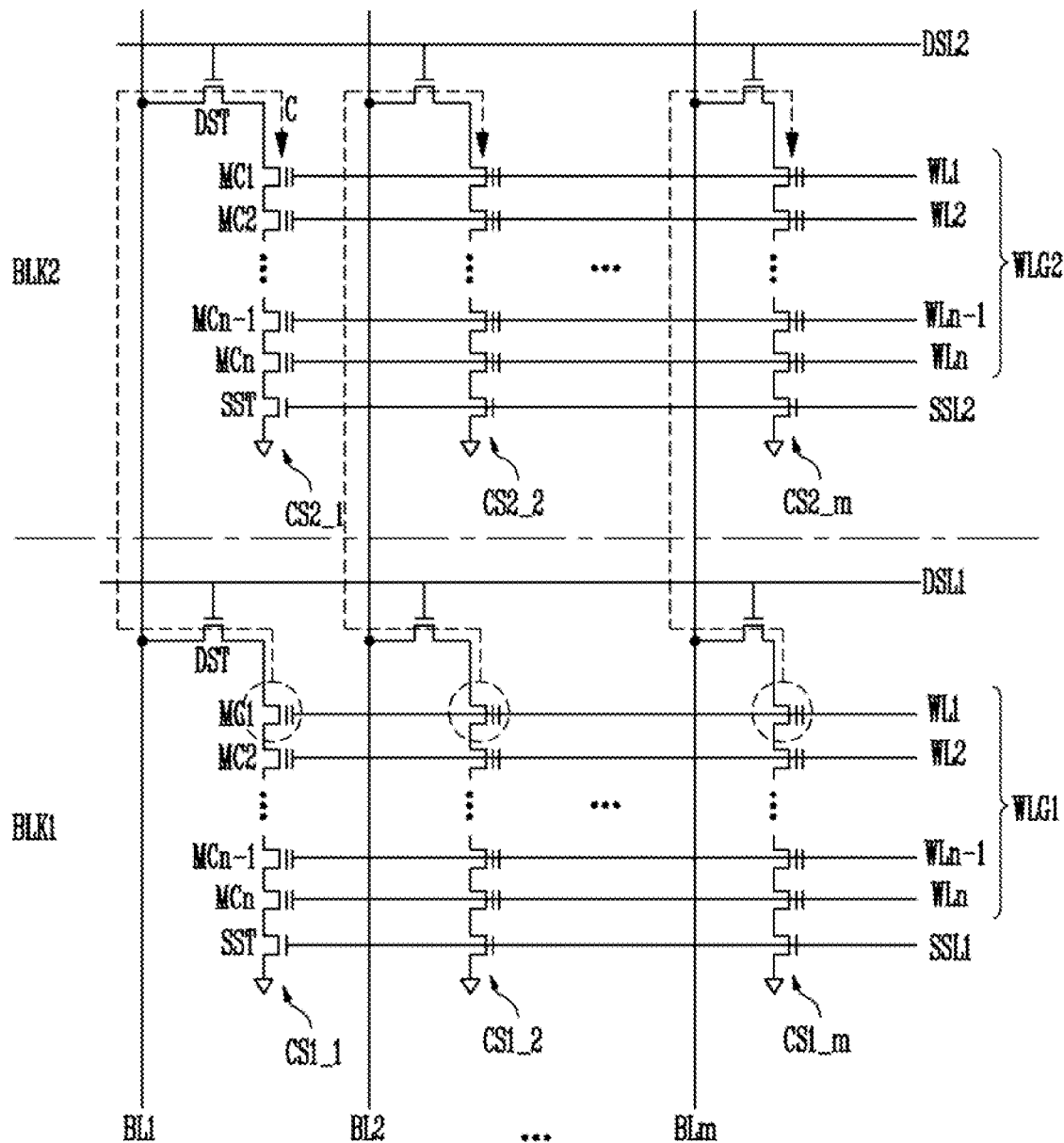
FIG. 7 is a diagram conceptually illustrating step S120 shown in FIG. 4.

FIG. 5 is a timing diagram illustrating an embodiment of step S110 and step S120 shown in FIG. 4. FIG. 6 is a diagram conceptually illustrating step S110 shown in FIG. 4. FIG. 7 is a diagram conceptually illustrating step S120 shown in FIG. 4.

First, referring to FIGS. 5 and 6, cell string mirrors may be defined through first to fourth times t1 to t4.

At the first time t1, the bit lines BL1 to BLm may be increased to a predetermined voltage (hereinafter, bit line voltage). The first to m-th page buffers PB1 to PBm may precharge the first to m-th bit lines BL1 to BLm to the bit line voltage, respectively.

A drain selection line voltage Vds1 may be applied to the first drain selection line DSL1 coupled to the first memory block BLK1. Drain selection transistors DST of the first memory block BLK1 may be turned on. The cell strings CS1_1 to CS1_m of the first memory block BLK1 may be electrically connected to the bit lines BL1 to BLm, respectively.

A reference voltage may be applied to the first source selection line SSL1 coupled to the first memory block BLK1. Source selection transistors SST of the first memory block BLK1 may be turned off, and the cell strings CS1_1 to CS1_m may be electrically separated from the reference voltage node.

A first pass voltage Vpass1 may be applied to a selected word line WLG1_s and an unselected word line WLG1_us of the first word line group WLG1. The first pass voltage Vpass1 may be a high voltage. The first to n-th memory cells MC1 to MCn of the first memory block BLK1 may be turned on regardless of threshold voltages thereof.

Therefore, the bit line voltage of the bit lines BL1 to BLm may be transferred to channels of the cell strings CS1_1 to CS1_m. The channels of the cell strings CS1_1 to CS1_m may be initialized by the bit line voltage (A in FIG. 6). Upon the initialization of the channels, the data of the selected page may be stably transferred through the bit lines BL1 to BLm.

A second pass voltage Vpass2 may be applied to the second word line group WLG2 coupled to the second memory block BLK2. The second pass voltage Vpass2 may be a high voltage. The first to n-th memory cells MC1 to MCn of the second memory block BLK2 may be turned on regardless of threshold voltages thereof. A channel may be formed in each of the cell strings CS2_1 to CS2_m. In other words, the cell strings CS2_1 to CS2_m may be defined as cell string mirrors.

According to an embodiment, the second pass voltage Vpass2 may be lower than a threshold value (e.g., program voltage) by which threshold voltages of the first to n-th memory cells MC1 to MCn of the second memory block BLK2 may be changed. Therefore, even when the second pass voltage Vpass2 is applied to the second word line group WLG2, the data stored in the first to n-th memory cells MC1 to MCn of the second memory block BLK2 may not be damaged.

The drain selection line voltage Vds1 may be applied to the second drain selection line DSL2 coupled to the second memory block BLK2. The drain selection transistors DST of the second memory block BLK2 may be turned on. The cell strings CS2_1 to CS2_m of the second memory block BLK2 may be electrically connected to the bit lines BL1 to BLm, respectively.

The reference voltage may be applied to the second source selection line SSL2 coupled to the second memory block BLK2. The cell strings CS2_1 to CS2_m may be electrically separated from the reference voltage node.

Therefore, the bit line voltage of the bit lines BL1 to BLm may be transferred to the channels of the cell strings CS2_1 to CS2_m. The channels of the cell strings CS2_1 to CS2_m may be initialized by the bit line voltage (B in FIG. 6).

At the second time t2, the selected word line WLG1_s of the first word line group WLG1 may be discharged. At the third time t3, the selected word line WLG1_s may be charged to a read voltage Vrd after being completely discharged. The memory cells of the selected word line WLG1_s (i.e., the selected page) may be turned on or off by threshold voltages thereof.

Subsequently, referring to FIGS. 5 and 7, the data of the selected page may be reflected on the cell string mirrors between the fourth time t4 and a fifth time t5.

At the fourth time t4, the first source selection line SSL1 coupled to the first memory block BLK1 may be provided with a source selection line voltage Vss1. The source selection transistors SST of the first memory block BLK1 may be turned on in response to the source selection line voltage Vss1. The cell strings CS1_1 to CS1_m may be electrically connected to the reference voltage node.

Therefore, the data of the selected page may be reflected on the bit lines BL1 to BLm (C in FIG. 7). The memory cells of the selected page may be turned on/off based on the data thereof. When the selected memory cell is turned on (On cell), electric charges of the corresponding bit line may be emitted to the reference voltage node through the corresponding cell string including the selected memory cell. A voltage of the corresponding bit line may be reduced to the reference voltage. When the selected memory cell is turned off (Off cell), electric charges of the corresponding bit line may be blocked by the selected memory cell and may not be emitted to the reference voltage node. The voltage of the corresponding bit line may be maintained.

Voltages of the channels of the cell strings CS2_1 to CS2_m may be changed by voltages of the bit lines BL1 to BLm. The cell strings CS2_1 to CS2_m may be electrically connected to the bit lines BL1 to BLm. When a voltage of a bit line is reduced, a voltage of a channel formed in the corresponding cell string may be reduced. When the voltage of the bit line is maintained, the voltage of the channel formed in the corresponding cell string may be maintained.

At the fifth time t5, the source selection line voltage Vss1 may be reduced to the reference voltage. The source selection transistors SST of the first memory block BLK1 may be turned off. Reflecting the data of the selected page on the cell strings CS2_1 to CS2_m may be terminated.

At a sixth time t6, a voltage of the second drain selection line DSL2 may be reduced to the reference voltage. A voltage of the second word line group WLG2 may be reduced to the reference voltage. The cell strings CS2_1 to CS2_m may be electrically separated from the bit lines BL1 to BLm and may not have channels.

Since each cell string has a predetermined capacitance, the quantity of electric charge of the cell strings CS2_1 to CS2_m may be maintained for a predetermined period of time. In other words, reliability of the data reflected on the cell strings CS2_1 to CS2_m may be maintained for a predetermined period of time.

According to an embodiment, cell strings of a memory block, which is arranged adjacent to the selected memory block, may be selected and defined as cell string mirrors. The bit lines BL1 to BLm may have a predetermined capacitance. When the cell string mirrors are adjacent to the selected memory block (i.e., the selected page), the data of the selected page may be efficiently reflected on the cell string mirrors through the bit lines BL1 to BLm. For example, when the first memory block BLK1 is selected, cell strings of the second memory block BLK2 may be defined as the cell string mirrors. Cell strings of a third memory block BLK3 may be defined as cell string mirrors when the second memory block BLK2 is selected.

Figure 8:
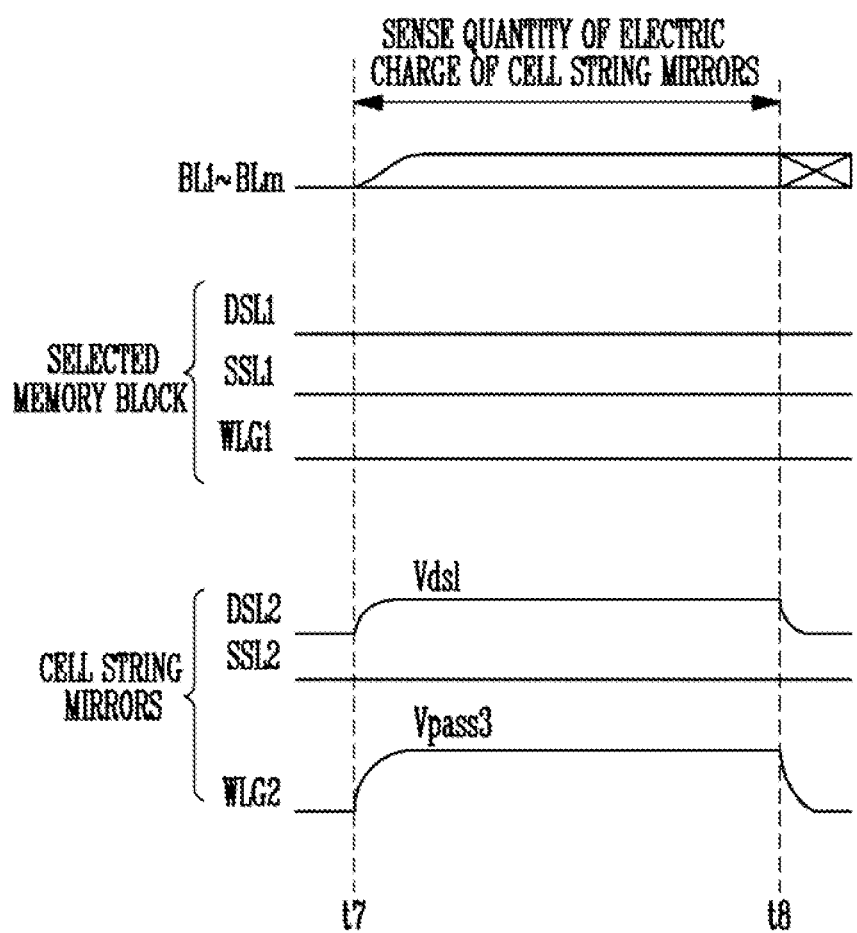
FIG. 8 is a timing diagram illustrating an embodiment of step S130 shown in FIG. 4.
Figure 9:
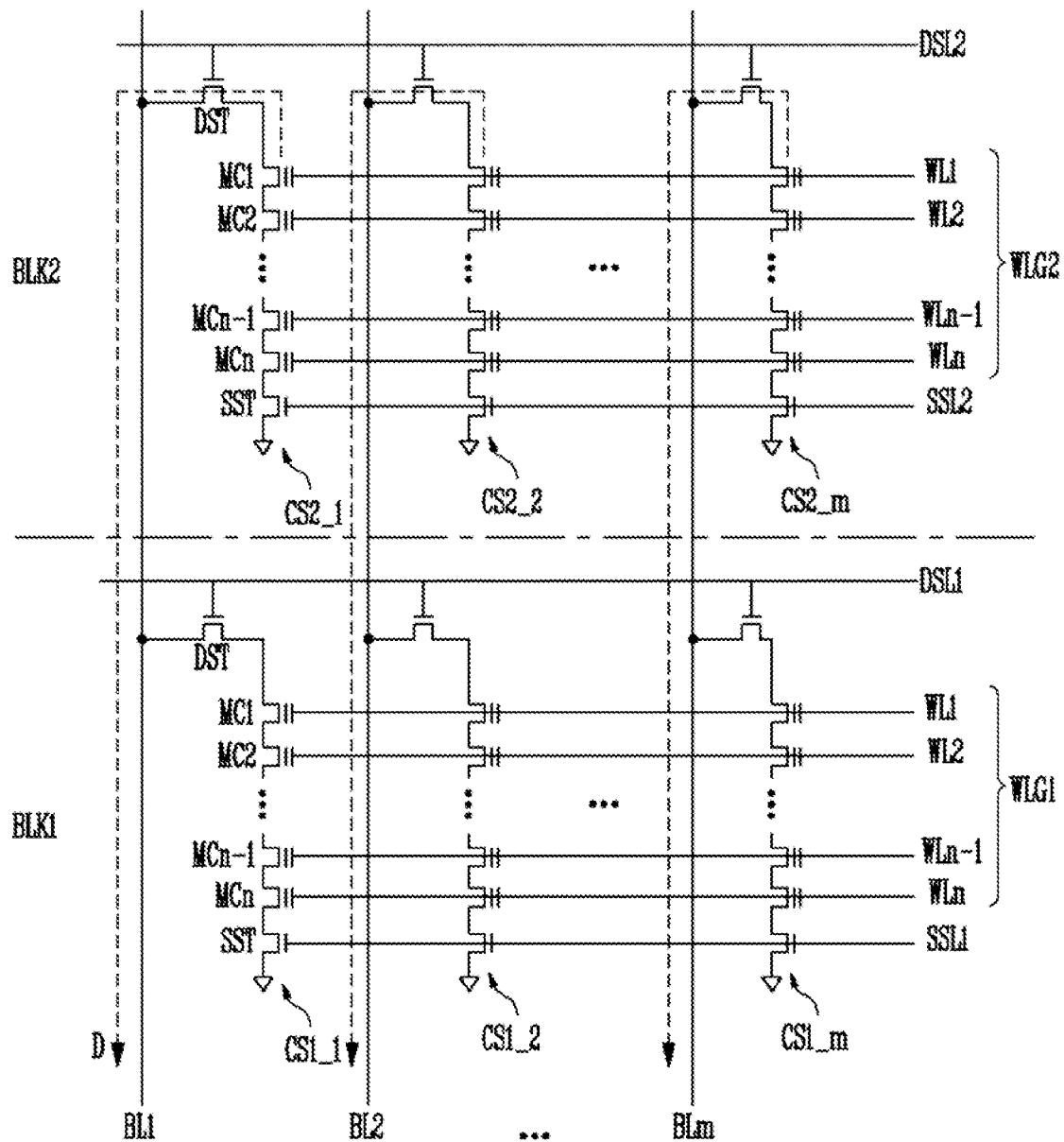
FIG. 9 is a diagram conceptually illustrating step S130 shown in FIG. 4.

FIG. 8 is a timing diagram illustrating an embodiment of step S130 shown in FIG. 4. FIG. 9 is a diagram conceptually illustrating step S130 shown in FIG. 4.

Referring to FIGS. 8 and 9, the quantity of electric charge of the cell string mirrors may be sensed between a seventh time t7 and an eighth time t8.

At the seventh time t7, the second drain selection line DSL2 coupled to the second memory block BLK2 may receive the drain selection line voltage Vds1. The drain selection transistors DST of the second memory block BLK2 may be turned on in response to the drain selection line voltage Vds1, and the cell strings CS2_1 to CS2_m may be electrically connected to the bit lines BL1 to BLm, respectively.

A third pass voltage Vpass3 may be applied to the second word line group WLG2. The first to third pass voltages Vpass1 to Vpass3 may be the same or different voltages. Channels may be formed in the cell strings CS2_1 to CS2_m in response to the third pass voltage Vpass3.

Therefore, the quantity of electric charge of the cell strings CS2_1 to CS2_m may be reflected on the bit lines BL1 to BLm, respectively (D in FIG. 9). The electric charges stored in the cell strings CS2_1 to CS2_m may move to the bit lines BL1 to BLm. Therefore, voltages of the bit lines BL1 to BLm may be changed. When a cell string is charged with electric charges, a voltage of a corresponding bit line may increase. When the cell string is not charged with electric charges, the voltage of the corresponding bit line may be maintained.

Between the seventh time t7 and the eighth time t8, the sensing signal SES, shown in FIG. 3, transferred to the page buffers PB1 to PBm may be enabled, so that the voltages of the bit lines BL1 to BLm may be sensed by the page buffers PB1 to PBm.

The first drain selection line DSL1, the first source selection line SSL1 and the first word line group WLG1 may maintain the reference voltage. The cell strings CS1_1 to CS1_m of the first memory block BLK1 may be electrically separated from the bit lines BL1 to BLm, respectively.

At the eighth time t8, the voltage of the second drain selection line DSL2 may be reduced to the reference voltage. The voltage of the second word line group WLG2 may also be reduced to the reference voltage.

Figure 10:
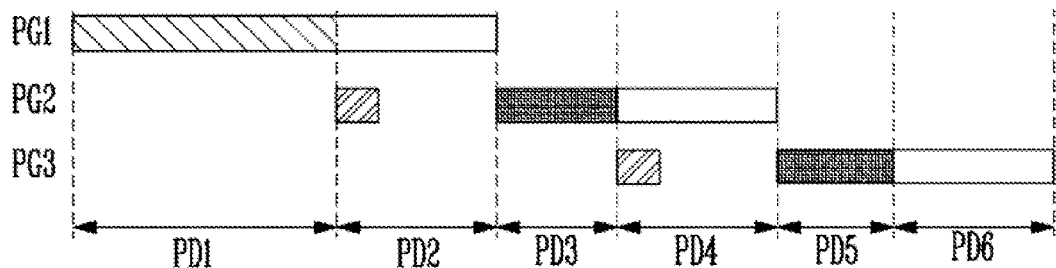
FIG. 10 is a flowchart illustrating a method of operating a semiconductor memory device according to an embodiment of the present invention.

FIG. 10 is a flowchart illustrating an operating method of the semiconductor memory device 100 according to an embodiment of the present invention. Hereinafter, it is described as an example that first to third pages PG1 to PG3 are sequentially selected and read. Addresses corresponding to the first to third pages PG1 to PG3 may be sequentially received from an external device and temporarily stored in the control logic 125.

According to an embodiment, the first to third pages PG1 to PG3 may be sequential pages in the same memory block. In another example, the first to third pages PG1 to PG3 may be non-sequential pages in the same memory block. In another example, the first to third PG1 to PG3 may be pages in different memory blocks.

Referring to FIG. 10, during a first period PD1, data of the first page PG1 may be read by the read and write circuit 123.

During a second period PD2, the data of the first page PG1 may be outputted from the read and write circuit 123. For example, during the second period PD2, the data of the read and write circuit 123 may be outputted to the input/output buffer 124. For another example, during the second period PD2, the data of the read and write circuit 123 may be externally outputted through the input/output buffer 124.

When the data of the read and write circuit 123 is outputted, the bit lines BL1 to BLm, shown in FIG. 2, may be used to reflect data of a next page (PG2) on the cell string mirrors. When the data of the read and write circuit 123 is outputted, the data of the second page PG2 may be reflected on the cell string mirrors through the bit lines BL1 to BLm.

For example, the second page PG2 may be included in the first memory block BLK1, shown in FIG. 2, and cell strings of the second memory block BLK2, shown in FIG. 2, may be defined as cell string mirrors. Data of the second page PG2 may be reflected on the cell string mirrors of the second memory block BLK2. Channels may be formed in the cell string mirrors of the second memory block BLK2 and initialized, and the data of the second page PG2 may be reflected on the initialized channels.

After the data of the first page PG1 is outputted from the read and write circuit 123, the data of the second page PG2 may be read from the cell string mirrors by the read and write circuit 123 during a third period PD3. The read and write circuit 123 may determine and store the data of the second page PG2 by sensing electric charges stored in the cell string mirrors.

During a fourth period PD4, the data of the second page PG2 may be outputted from the read and write circuit 123. When the data of the second page PG2 is outputted, the bit lines BL1 to BLm may be used to reflect data of the third page PG3 in the cell string mirrors. When the data of the read and write circuit 123 is outputted, the data of the third page PG3 may be reflected on the cell string mirrors.

For example, in substantially the same manner as the second page PG2, the third page PG3 may be included in the first memory block BLK1. In substantially the same manner as the cell string mirrors related to the second page PG2, the cell strings of the second memory block BLK2 may be defined as cell string mirrors. On the other hand, unlike the cell string mirrors related to the second page PG2, the cell strings of the third memory block BLK3, shown in FIG. 2, may be defined as cell string mirrors.

In another example, the third page PG3 may be included in a memory block different from the second page PG2, for example, the third memory block BLK3. In substantially the same manner as the cell string mirrors related to the second page PG2, the cell strings of the second memory block BLK2 may be defined as cell string mirrors. On the other hand, unlike the cell string mirrors related to the second page PG2, for example, cell strings of a fourth memory block BLK4 may be defined as cell string mirrors.

After the data of the second page PG2 is outputted, the data of the third page PG3 may be read from the cell string mirrors by the read and write circuit 123 during a fifth period PD5. In addition, during a sixth period PD6, the data of the third page PG3 may be outputted from the read and write circuit 123.

As described above, reflecting data of a selected page on cell string mirrors may overlap with outputting data of another page. Therefore, the speed of the read operation of the semiconductor memory device 100 may be improved.

Figure 11:
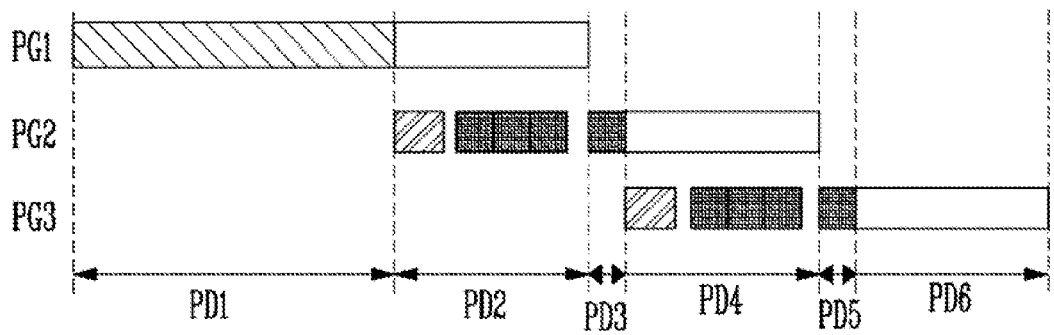
FIG. 11 is a flowchart illustrating a method of operating a semiconductor memory device according to another embodiment of the present invention.

FIG. 11 is a flowchart illustrating an operating method of the semiconductor memory device 100 according to another embodiment of the present invention.

Referring to FIG. 11, during the first period PD1, the data of the first page PG1 may be read by the read and write circuit 123. During the second period PD2, the data of the first page PG1 may be outputted from the read and write circuit 123.

When the data of the first page PG1 is outputted, the data of the second page PG2 may be reflected on the cell string mirrors.

When the data of the first page PG1 is outputted, the data of the second page PG2 may be read from the cell string mirrors. According to an embodiment, the data stored in the page buffers PB1 to PBm, shown in FIG. 1, may be outputted in units of predetermined bits to the data lines DL, as shown in FIGS. 1 and 3. For example, the data stored in the page buffers PB1 to PBm may be transferred in units of eight bits to the input/output buffer 124 through the data lines DL. By controlling the input/output circuit 230 of each of the page buffers PB1 to PBm, the data stored in the page buffers PB1 to PBm may be outputted in units of predetermined bits to the data lines DL. The number of page buffers that finish outputting the data of the first page PG1 may gradually increase over time.

According to an embodiment, the page buffers PB1 to PBm may be divided into a plurality of groups. A group of the page buffers that finish outputting the data of the first page PG1 may read the data of the second page PG2 from the cell string mirrors through corresponding bit lines. In other words, the plurality of groups may sequentially read the data of the second page PG2 from the cell string mirrors through the corresponding bit lines.

For example, by controlling the sensing signal SES, shown in FIG. 3, provided to the page buffers of each group, the plurality of groups may sequentially sense corresponding cell string mirrors.

FIG. 11 illustrates that the page buffers PB1 to PBm are divided into four groups and the four groups sequentially read the data of the second page PG2 from corresponding cell string mirrors. The last group, among the four groups, may read the data of the second page PG2 from the corresponding cell string mirrors during the third period PD3 after completely outputting the data of the first page PG1 stored therein.

After the data of the second page PG2 is read from the cell string mirrors, the data of the second page PG2 read by the read and write circuit 123 may be outputted during the fourth period PD4.

When the data of the second page pg2 is outputted from the read and write circuit 123, the data of the third page PG3 may be reflected on the cell string mirrors.

In addition, when the data of the second page PG2 is outputted, the data of the third page PG3 may be read from the cell string mirrors. The page buffers PB1 to PBm may be divided into four groups, and the four groups may sequentially read the data of the third page PG3 from the cell string mirrors. The last group, among the four groups, may read the data of the third page PG3 from the corresponding cell string mirrors during the fifth period PD5 after completely outputting the data of the second page PG2 stored therein.

During the sixth period PD6, the data of the third page PG3 may be outputted from the read and write circuit 123.

According to an embodiment, reflecting data of a selected page on cell string mirrors may overlap with outputting data of another page. Further, reading the data of the selected page by sensing the cell string mirrors may overlap with outputting the data of another page. Therefore, the speed of the read operation of the semiconductor memory device 100 may be increased.

Figure 12:
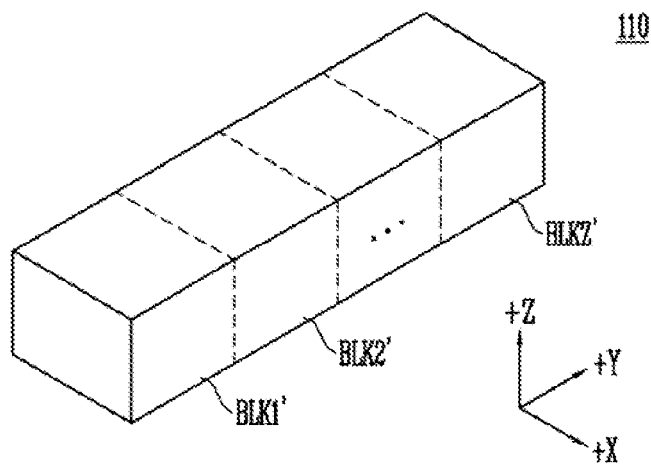
FIG. 12 is a block diagram illustrating an embodiment of the memory cell array shown in FIG. 1.

FIG. 12 is a block diagram illustrating an embodiment of the memory cell array 110 shown in FIG. 1.

Referring to FIG. 12, the memory cell array 110 may include a plurality of memory blocks BLK1' to BLKz'. Each of the memory blocks BLK1' to BLKz' may have a three-dimensional structure. Each memory block may include a plurality of memory cells stacked over a substrate. The plurality of memory cells may be arranged in a +X direction, a +Y direction and a +Z direction. The structure of each memory block is described in detail with reference to FIGS. 13 and 14.

Figure 13:
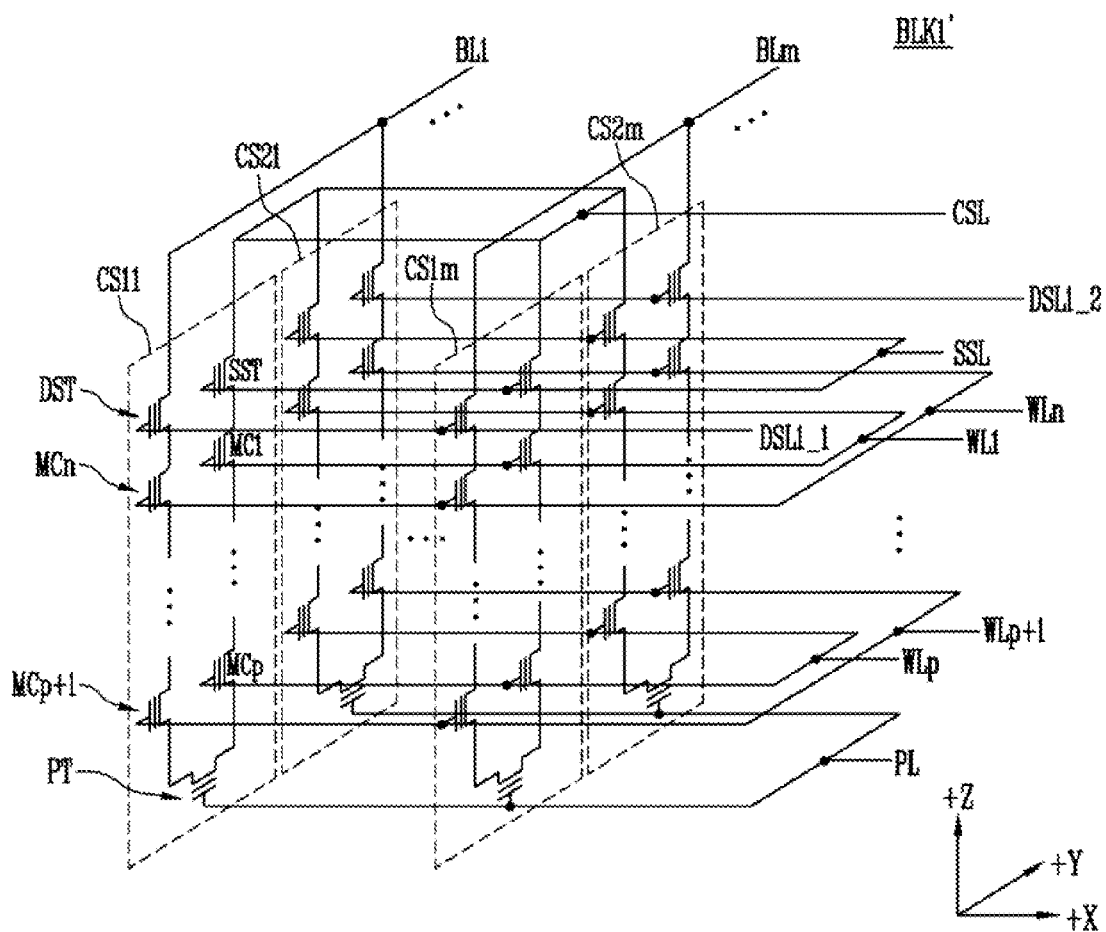
FIG. 13 is a circuit diagram Illustrating an embodiment of one of the memory blocks shown in FIG. 12.

FIG. 13 is a circuit diagram illustrating an embodiment of one (BLK1') of the memory blocks BLK1' to BLKz' shown in FIG. 12.

Referring to FIG. 13, the first memory block BLK1' may include a plurality of cell strings CS11 to CS1$m$ and CS21 to CS2$m$. In the first memory block BLK1', m-numbered cell strings may be arranged in a row direction (i.e., +X direction). The m-numbered cell strings arranged in the row direction may be coupled to the first to m-th bit lines BL1 to BLm, respectively. A plurality of cell strings may be arranged in a column direction (i.e., +Y direction). For a simplified illustration, FIG. 13 illustrates only two cell strings arranged in the column direction.

Each of the cell strings CS11 to CS1$m$ and CS21 to CS2$m$ may be formed in a U shape. Each of the cell strings CS11 to CS1$m$ and CS21 to CS2$m$ may include a pipe transistor PT, memory cells MC1 to MCn, a source selection transistor SST and a drain selection transistor DST stacked over a substrate (not illustrated) under the memory block BLK1'.

The selection transistors SST and DST and the memory cells MC1 to MCn may have similar structures. For example, each of the selection transistors SST and DST and the memory cells MC1 to MCn may include a channel layer, a tunneling insulating layer, a charge storage layer and a blocking insulating layer.

The source selection transistor SST of each of the cell strings CS11 to CS1$m$ and CS21 to CS2$m$ may be coupled between a common source line CSL and memory cells MC1 to MCp. Gates of source selection transistors SST may be coupled in common to a source selection line SSL1.

The first to n-th memory cells MC1 to MCn of each cell string may be coupled between the source selection transistor SST and the drain selection transistor DST.

The first to n-th memory cells MC1 to MCn may be divided into first to p-th memory cells MC1 to MCp and p+1-th to n-th memory cells MCp+1 to MCn. The first p-th memory cells MC1 to MCp and the p+1-th to n-th memory cells MCp+1 to MCn may be couples through the pipe transistor PT. The first p-th memory cells MC1 to MCp may be sequentially arranged in a reverse direction to the +Z direction and be coupled in series between the source selection transistor SST and the pipe transistor PT. The p+1-th to n-th memory cells MCp+1 to MCn may be sequentially stacked in the +Z direction and be coupled in series between the pipe transistor PT and the drain selection transistor DST. Gates of the first to p-th memory cells MC1 to MCp may be coupled to first to p-th word lines WL1 to Wlp, respectively. Gates of the p+1-th to n-th memory cells MCp+1 to MCn may be coupled to p+1-th to n-th word lines WLp+1 to WLn, respectively.

A gate of the pipe transistor PT of each cell string may be coupled to a pipe line PL.

The drain selection transistor DST of each cell string may be coupled between the corresponding bit line and the p+1-th to n-th memory cells MCp+1 to MCn. The drain selection transistors DST of the cell strings CS11 to CSLm in a first row may be coupled to a first drain selection line DSL1_1. The drain selection transistors DST of the cell strings CS21 to CS2$m$ in a second row may be coupled to a second drain selection line DSL1_2.

As a result, cell strings (e.g., CS11 to CS1$m$) arranged in the same row (+X direction) may be coupled to the same drain selection line (e.g., DSL1_1). Cell strings (e.g., CS11 and CS21) arranged in different rows may be coupled to different drain selection lines (e.g., DSL1_1 and DSL1_2).

The scope of the present invention is applicable to a semiconductor memory device including a memory cell array having a three-dimensional structure.

During a read operation, it is described as an example that the first memory block BLK1' is selected.

One of the drain selection lines DSL1_1 and DSL1_2 may be selected. Cell strings coupled to the selected drain selection line may be electrically connected to the bit lines BL1 to BLm. Cell strings coupled to an unselected drain selection line may be electrically separated from the bit lines BL1 to BLm. In terms of the cell strings electrically connected to the bit lines BL1 to BLm, the first memory block BLK1' may be illustrated in a substantially similar manner to the first memory block BLK1 shown in FIGS. 6, 7 and 9.

As one of the word lines WL1 to WLn is selected, one page may be selected among the selected cell strings.

The selected drain selection line, the source selection line SSL, the word lines WL1 to WLn of the first memory block BLK1' may be controlled under bias conditions for the first drain selection line DSL1, the first source selection line SSL1 and the first word line group WLG1 described with reference to FIGS. 5 to 9. The pipe line PL may be controlled in substantially the same manner as the selected drain selection line. The reference voltage may be applied to the common source line CSL, which may operate as a reference voltage node.

During a read operation, it is described as an example that the cell strings of a second memory block BLK2' are defined as cell string mirrors.

One of the drain selection lines DSL1_1 and DSL1_2 in the second memory block BLK2' may be selected. Cell strings coupled to the selected drain selection line may be electrically connected to the bit lines BL1 to BLm. Cell strings of an unselected drain selection line may be electrically separated from the bit lines BL1 to BLm. In terms of the cell strings electrically connected to the bit lines BL1 to BLm, the second memory block BLK2' may be illustrated in a substantially similar manner to the second memory block BLK2 shown in FIGS. 6, 7 and 9.

Cell strings coupled to the selected drain selection line in the second memory block BLK2' may be defined as cell string mirrors.

The selected drain selection line, the source selection line SSL and the word lines WL1 to WLn of the second memory block BLK2' may be controlled under substantially the same bias conditions for the second drain selection line DSL2, the second source selection line SSL2 and the second word line group WLG2 described with reference to FIGS. 5 and 9. The pipe line PL may be controlled in substantially the same manner as the selected drain selection line.

Therefore, the data of the selected page of the first memory block BLK1' may be reflected on the channels of the cell string mirrors of the second memory block BLK2', and the cell string mirrors may be sensed, so that the data of the selected page may be determined.

Figure 14:
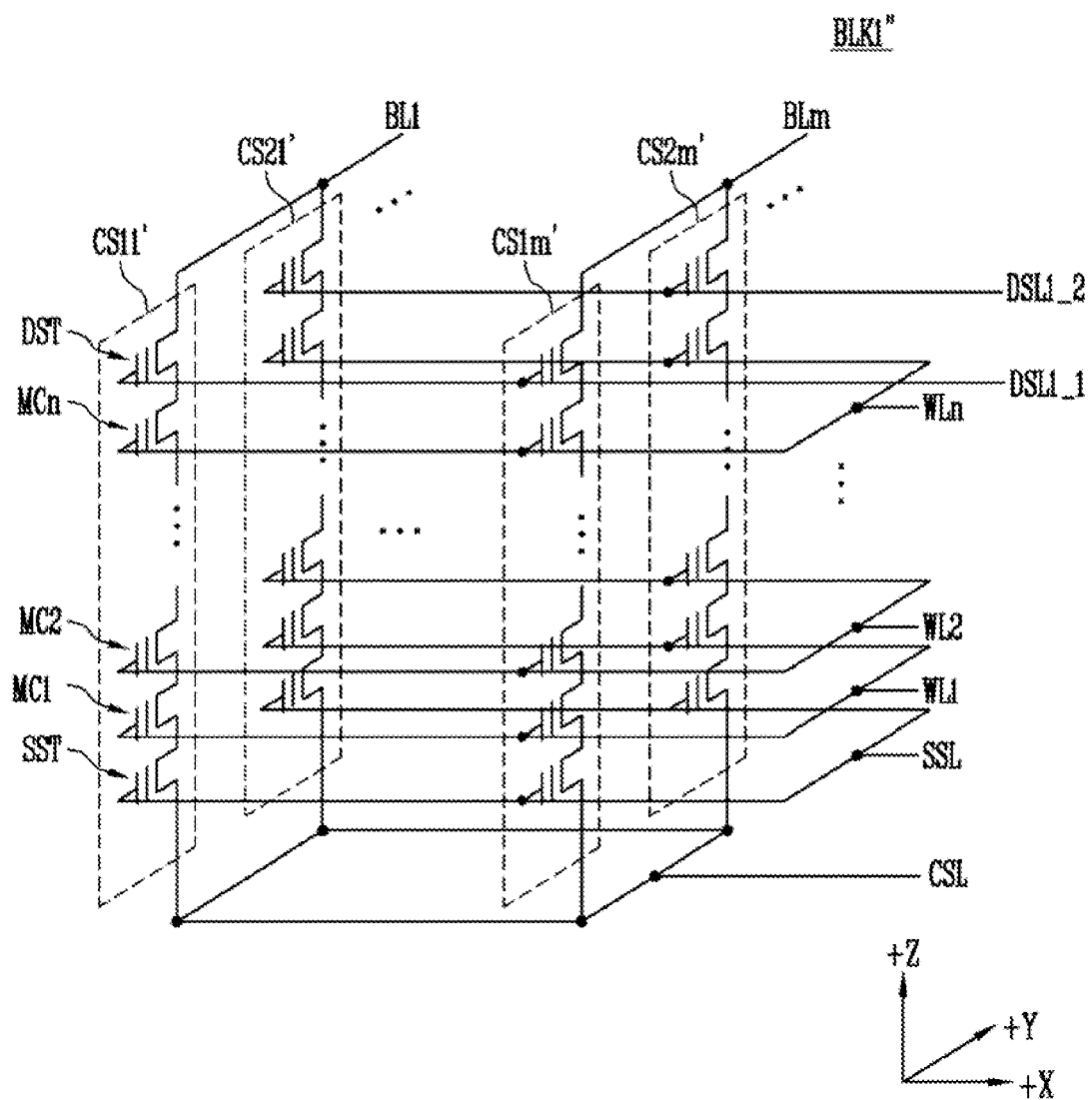
FIG. 14 is a circuit diagram illustrating another embodiment of one of the memory blocks shown in FIG. 12.

FIG. 14 is a circuit diagram illustrating another embodiment (BLK1") of one of the memory blocks BLK1' to BLKz' shown in FIG. 12.

Referring to FIG. 14, a first memory block BLK1" may include a plurality of cell strings CS11' to CS1$m$' and CS21' to CS2$m$'. In the first memory block BLK1", m-numbered cell strings may be arranged in the row direction (i.e., +X direction). The m-numbered cell strings arranged in the row direction may be coupled to the first to m-th bit lines BL1 to BLm, respectively. A plurality of cell strings may be arranged in the column direction (i.e., +Y direction). FIG. 14 illustrates two cell strings arranged in a column direction for simple description.

Each of the cell strings CS11' to CS1$m$' and CS21' to CS2$m$' may extend in the +Z direction. Each of the cell strings CS11' to CS1$m$' and CS21' to CS2$m$' may include a source selection transistor SST, first to n-th memory cells MC1 to MCn, and a drain selection transistor DST stacked over a substrate (not illustrated) under the memory block BLK1".

The source selection transistors SST of the cell strings CS11' to CS1$m$' and CS21' to CS2$m$' may be coupled in common to a common source line CSL. The source selection transistor SST of each of the cell strings CS11' to CS1$m$' and CS21' to CS2$m$' may be coupled between the common source line CSL and the memory cells MC1 to MCn. Gates of the source selection transistors SST of the cell strings CS11' to CS1$m$' and CS21' to CS2$m$' may be coupled to a source selection line SSL.

The first to n-th memory cells MC1 to MCn of each cell string may be coupled in series between the source selection transistor SST and the drain selection transistor DST. Memory cells at the same level may be coupled to the same word line. The first to n-th memory cells MC1 to MCn may be coupled to the first to n-th word lines WL1 to WLn, respectively.

The drain selection transistor DST of each cell string may be coupled between the corresponding bit line and the memory cells MC1 to MCn. Drain selection transistors of the cell strings arranged in the same row (+X direction) may be coupled to the same drain selection line. The drain selection transistors DST of the cell strings CS11' to CS1$m$' in a first row may be coupled to a first drain selection line DSL1_1. The drain selection transistors DST of the cell strings CS21 to CS2$m$ in a second row may be coupled to a second drain selection line DSL1_2.

As a result, the memory block BLK1"shown in FIG. 14 may have a similar equivalent circuit to the memory block BLK1' shown in FIG. 13 except that the pipe selection transistor PT is not formed in each cell string.

Figure 15:
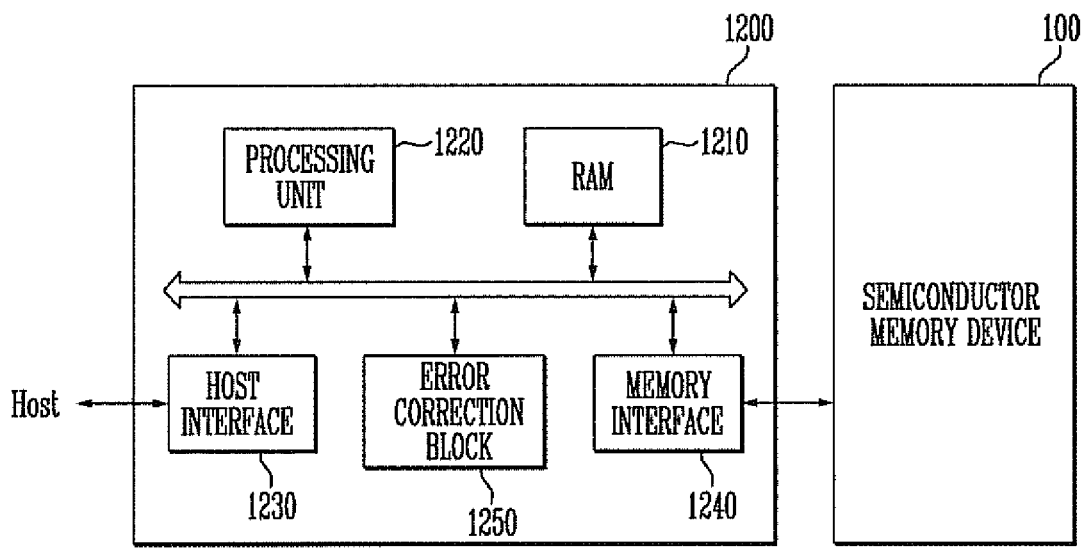
FIG. 15 is a block diagram illustrating a memory system including the semiconductor memory device shown in FIG. 1.

FIG. 15 is a block diagram illustrating a memory system 1000 including the semiconductor memory device 100 shown in FIG. 1.

Referring to FIG. 15, the memory system 1000 may include the semiconductor memory device 100 and a controller 1200.

The semiconductor memory device 100 may be configured and operated in substantially the same manner as described above with reference to FIGS. 1 to 14. Thus, a detailed description thereof will be omitted.

The controller 1200 may be coupled to a host and the semiconductor memory device 100. The controller 1200 may access the semiconductor memory device 100 at the request of the host. For example, the controller 1200 may control a read operation, a program operation, an erase operation, and/or a background operation of the semiconductor memory device 100. The controller 1200 may provide an interface between the semiconductor memory device 100 and the host. The controller 1200 may be configured to drive firmware for controlling the semiconductor memory device 100.

The controller 1200 may include a random access memory (RAM) 1210, a processing unit 1220, a host interface 1230, a memory interface 1240 and an error correction block 1250.

The RAM 1210 may be used as operation memory of the processing unit 1220, a cache memory between the semiconductor memory device 100 and the host, and/or a buffer memory between the semiconductor memory device 100 and the host.

The processing unit 1220 may control operations of the controller 1200.

The host interface 1230 may include a protocol for exchanging data between the host and the controller 1200. For example, the controller 1200 may communicate with the host through at least one of various protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a private protocol, etc.

The memory interface 1240 may interface with the semiconductor memory device 100. For example, the memory interface 1240 may include a NAND flash interface or a NOR flash interface.

The error correction block 1250 may detect and correct errors in data read from the semiconductor memory device 100 by using an error correction code (ECC).

The controller 1200 and the semiconductor memory device 100 may be integrated in one semiconductor device. For example, the controller 1200 and the semiconductor memory device 100 may be integrated in a single semiconductor device to form a memory card such as a PC card (personal computer memory card international association (PCM-CIA)), a compact flash card (CF), a smart media card (SMC), a memory stick, a multimedia card (MMC, RS-MMC or MMCmicro), an SD card (SD, miniSD, micro SD or SDHC), a universal flash storage device (UFS), etc.

The controller 1200 and the semiconductor memory device 100 may be integrated in a single semiconductor device to form a solid state drive (SSD). The SSD may include a storage device for storing data in a semiconductor memory device. When the memory system 1000 is used as an SSD, operational rates of the host coupled to the memory system 1000 may be significantly improved.

In another example, the memory system 1000 may be used as one of several elements in various electronic devices such as a computer, an ultra mobile PC (UMPC), a workstation, a net-book, a personal digital assistant (PDA), a portable computer, a web table, a wireless phone, a mobile phone, a smart phone, an e-book, a portable multimedia player (PMP), a portable game machine, a navigation device, a black box, a digital camera, a three-dimensional television, a digital audio recorder, a digital audio player, a digital picture recorder, a digital picture player, a digital video recorder, a digital video player, a device for transmitting/receiving information in wireless environments, a device for home networks, a device for computer networks, a device for telematics networks, an RFID device, and other devices for computing systems.

According to an exemplary embodiment, the semiconductor memory device 100 or the memory system 1000 may be packaged in various forms. For example, the semiconductor memory device 100 or the memory system 1000 may be packaged by various methods such as a package on package (PoP), a ball grid array (BGA), a chip scale package (CSP), a plastic leaded chip carrier (PLCC), a plastic dual in line package (PDIP), a die in waffle pack, a die in wafer form, a chip on board (COB), a ceramic dual in line package (CERDIP), a plastic metric quad flat package (MQFP), a thin quad flat package (TQFP), a small outline integrated circuit (SOIC), a shrink small outline package (SSOP), a thin small outline package (TSOP), a system in package (SIP), a multi chip package (MCP), a wafer-level fabricated package (WFP), a wafer-level processed stack package (WSP), etc.

Figure 16:
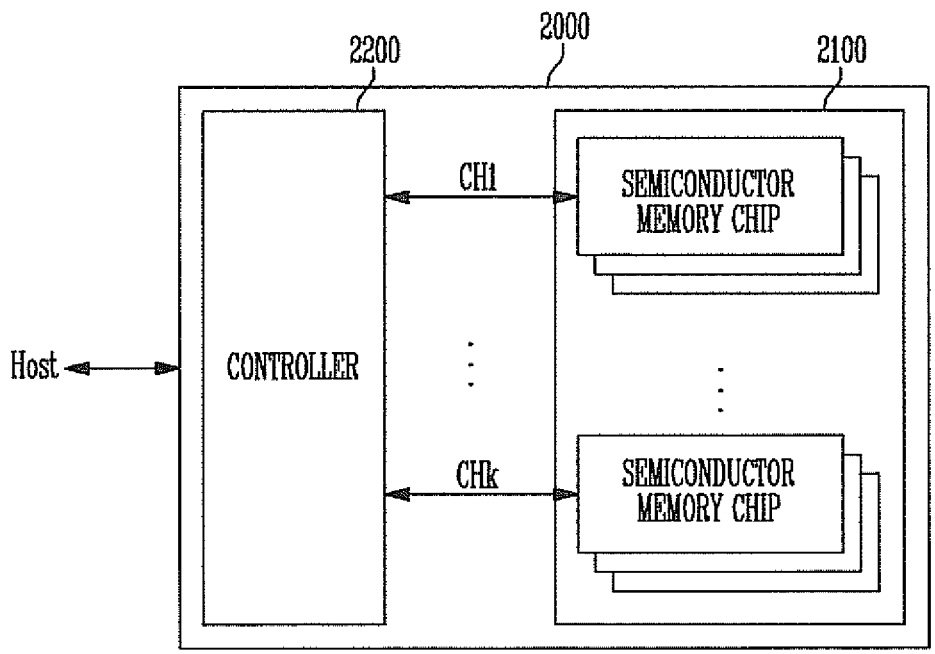
FIG. 16 is a block diagram illustrating an application example shown in FIG. 15.

FIG. 16 is a block diagram Illustrating an application example (2000) of the memory system 1000 shown in FIG. 15.

Referring to FIG. 16, a memory system 2000 may include a semiconductor memory device 2100 and a controller 2200. The semiconductor memory device 2100 may include semiconductor memory chips. The semiconductor memory chips may be divided into groups.

FIG. 16 illustrates the groups communicating with the controller 2200 through first to k-th channels CH1 to CHk. Each of the semiconductor memory chips may be configured and operated in substantially the same manner as the semiconductor memory device 100 described above with reference to FIG. 1.

Each group may communicate with the controller 2200 through a single common channel. The controller 2200 may be configured in substantially the same manner as the controller 1200 described with reference to FIG. 15, and configured to control the plurality of semiconductor memory chips of the semiconductor memory device 2100.

As illustrated in FIG. 16, a plurality of semiconductor memory chips may be coupled to a single channel. However, the memory system 2000 may be modified so that a single semiconductor memory chip may be coupled to a single channel.

Figure 17:
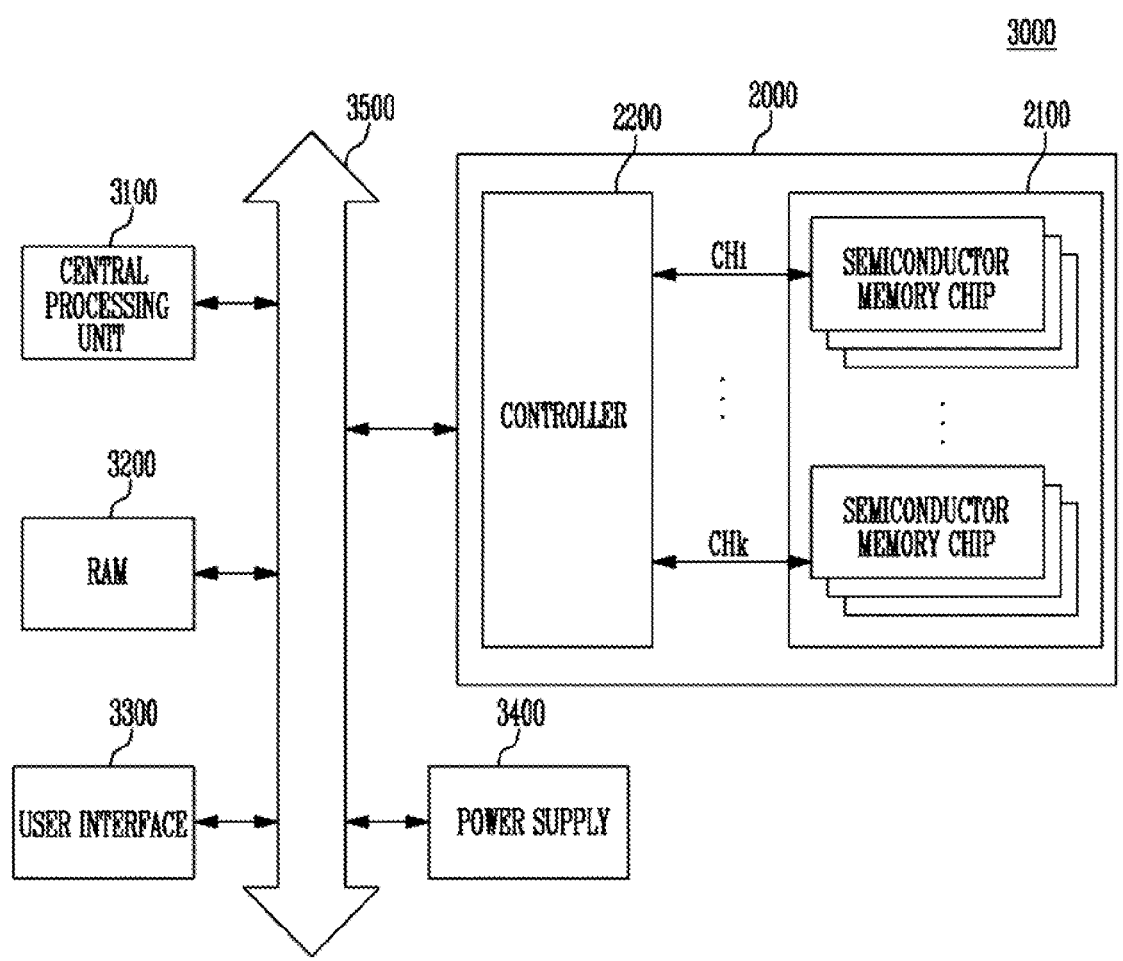
FIG. 17 is a block diagram illustrating a computing system including the memory system described with reference to FIG. 16.

FIG. 17 is a block diagram illustrating a computing system 3000 having the memory system 2000 described above with reference to FIG. 16.

Referring to FIG. 17, the computing system 3000 may include a central processing unit 3100, a random access memory (RAM) 3200, a user interface 3300, a power supply 3400, a system bus 3500, and a memory system 2000.

The memory system 2000 may be electrically connected to the central processing unit 3100, the RAM 3200, the user interface 3300 and the power supply 3400 through the system bus 3500. Data provided through the user interface 3300 or processed by the central processing unit 3100 may be stored in the memory system 2000.

In FIG. 17, the semiconductor memory device 2100 may be coupled to the system bus 3500 through the controller 2200. However, the semiconductor memory device 2100 may be directly coupled to the system bus 3500. The central processing unit 3100 and the RAM 3200 may perform functions of the controller 2200.

As illustrated in FIG. 17, the computing system 3000 may include the memory system 2000 shown in FIG. 16. However, the memory system 2000 may be replaced with the memory system 1000 shown in FIG. 15. According to an embodiment, the computing system 3000 may include both of the memory systems 1000 and 2000 described above with reference to FIGS. 15 and 16.

According to an embodiment of the present invention, a semiconductor memory device having improved read speed and a method of operating the same are provided.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. An operating method of a semiconductor memory device including a first cell string and a second cell string sharing a bit line and coupled to a first word line group and a second word line group, respectively, the operating method comprising:
    forming a channel in the second cell string by applying a first pass voltage to the second word line group;
    reflecting data of a selected memory cell coupled to a selected word line of the first word line group, among memory cells of the first cell string, on the channel of the second cell string through the bit line; and
    determining the data of the selected memory cell by sensing a quantity of electric charge of the second cell string through the bit line.

2. The operating method of claim 1, wherein the forming of the channel in the second cell string comprises:
    applying a bit line voltage to the bit line; and
    initializing the channel of the second cell string in response to the bit line voltage by electrically connecting the second cell string to the bit line.

3. The operating method of claim 2, wherein the reflecting of the data of the selected memory cell on the channel of the second cell string comprises:
    reflecting the data of the selected memory cell on the bit line,
    wherein the quantity of electric charge of the second cell string varies with a voltage of the bit line.

4. The operating method of claim 1, further comprising:
    electrically separating the second cell string from the bit line after the data of the selected memory cell is reflected on the channel of the second cell string.

5. The operating method of claim 1, wherein the determining of the data of the selected memory cell comprises:
    forming the channel in the second cell string by applying a second pass voltage to the second word line group; and
    electrically connecting the channel of the second cell string to the bit line to reflect the quantity of electric charge of the second cell string on the bit line.

6. The operating method of claim 5, wherein the determining of the data of the selected memory cell further comprises:
    determining the data of the selected memory cell by sensing a voltage of the bit line.

7. The operating method of claim 1, wherein, in the determining of the data of the selected memory cell, the first cell string is electrically separated from the bit line.

8. The operating method of claim 1, further comprising:
    forming a channel in the first cell string by applying a bit line voltage to the bit line and applying a second pass voltage to the first word line group; and
    initializing the channel of the first cell string in response to the bit line voltage by electrically connecting the first cell string to the bit line.

9. The operating method of claim 1, wherein the determining of the data of the selected memory cell is performed within a predetermined period of time after the reflecting of the data of the selected memory cell on the channel of the second cell string.

10. A semiconductor memory device, comprising:
a first cell string coupled to a first word line group;
a second cell string coupled to a second word line group and suitable for sharing a bit line with the first cell string; and
a peripheral circuit suitable for forming a channel in the second cell string by applying a pass voltage to the second word line group, reflecting data of a selected memory cell in the first cell string on the channel of the second cell string through the bit line, and determining the data of the selected memory cell by sensing a quantity of electric charge of the channel of the second cell string through the bit line.

11. The semiconductor memory device of claim 10, wherein the peripheral circuit comprises:
an address decoder coupled to the first and second word line groups; and
a page buffer suitable for providing a bit line voltage to the bit line,
wherein the address decoder is suitable for applying the pass voltage to the second word line group to form the channel in the second cell string, and electrically connecting the second cell string to the bit line to initialize the channel of the second cell string in response to the bit line voltage.

12. The semiconductor memory device of claim 11, wherein the address decoder selects a word line from the first word line group, electrically connects the first cell string to the bit line and reflects the data of the selected memory cell on the bit line, and
the quantity of electric charge of the channel of the second cell string varies with a voltage of the bit line.

13. An operating method of a semiconductor memory device, comprising:
reflecting data bits of a first page in first cell strings on channels of second cell strings through bit lines, wherein the first and second cell strings are suitable for sharing bit lines and coupled to a first word line group and a second word line group, respectively;
determining and storing the data bits of the first page by sensing a quantity of electric charge of the channels of the second cell strings through the bit lines; and
outputting the data bits of the first page.

14. The operating method of claim 13, further comprising:
reflecting data bits of a second page in the first cell strings on channels of third cell strings through the bit lines during the outputting of the data bits of the first page,
wherein the third cell strings are coupled to a third word line group and suitable for sharing the bit lines with the first cell strings.

15. The operating method of claim 14, further comprising:
determining and storing the data bits of the second page by sensing a quantity of electric charge of the channels of the third cell strings through the bit lines; and
outputting the data bits of the second page.

16. The operating method of claim 15, wherein the sensing of the quantity of electric charge of the channels of the third cell strings is performed during the outputting of the data bits of the first page.

17. The operating method of claim 13, further comprising:
reflecting data bits of a second page of the first cell strings on the channels of the second cell strings through the bit lines during the outputting of the data bits of the first page.

18. The operating method of claim 17, further comprising:
determining and storing the data bits of the second page by sensing the quantity of electric charge of the channels of the second cell strings through the bit lines; and
outputting the data bits of the second page.

19. The operating method of claim 13, further comprising:
reflecting data bits of a second page of third cell strings on the channels of the second cell strings through the bit lines during the outputting of the data bits of the first page;
determining and storing the data bits of the second page by sensing the quantity of electric charge of the channels of the second cell strings through the bit lines; and
outputting the data bits of the second page,
wherein the third cell strings are coupled to a third word line group and suitable for sharing the bit lines with the second cell strings.

20. The operating method of claim 13, further comprising:
reflecting data bits of a second page of third cell strings on channels of fourth cell strings through the bit lines during the outputting of the data bits of the first page;
determining and storing the data bits of the second page by sensing a quantity of electric charge of the channels of the fourth cell strings through the bit lines; and
outputting the data bits of the second page,
wherein the third and fourth cell strings are suitable for sharing bit lines and coupled to a third word line group and a fourth word line group, respectively.

* * * * *